US008716127B2

(12) United States Patent
Yang et al.

(10) Patent No.: US 8,716,127 B2
(45) Date of Patent: *May 6, 2014

(54) METAL ALLOY CAP INTEGRATION

(71) Applicant: International Business Machines Corporation, Armonk, NY (US)

(72) Inventors: Chih-Chao Yang, Glenmont, NY (US); Marc A. Bergendahl, Albany, NY (US); Steven J. Holmes, Guilderland, NY (US); David V. Horak, Albany, NY (US); Charles W. Koburger, Delmar, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,265

(22) Filed: May 11, 2013

(65) Prior Publication Data

US 2013/0252419 A1 Sep. 26, 2013

Related U.S. Application Data

(63) Continuation of application No. 13/653,665, filed on Oct. 17, 2012, now Pat. No. 8,492,274, which is a continuation-in-part of application No. 13/290,557, filed on Nov. 7, 2011.

(51) Int. Cl.
*H01L 21/44* (2006.01)
*H01L 21/768* (2006.01)

(52) U.S. Cl.
CPC .... *H01L 21/76858* (2013.01); *H01L 21/76877* (2013.01)
USPC .... 438/652; 438/653; 438/654; 257/E21.577; 257/E21.578

(58) Field of Classification Search
CPC ............ H01L 21/768; H01L 21/76802; H01L 21/76807; H01L 21/76832; H01L 21/76837; H01L 21/76838; H01L 21/76849; H01L 21/7685; H01L 21/76853; H01L 21/76855; H01L 27/76858; H01L 21/76864; H01L 21/76877
USPC ......... 438/618–625, 628, 633, 637–639, 644, 438/646, 652; 257/E21.557, E27.578
See application file for complete search history.

(56) References Cited

U.S. PATENT DOCUMENTS 6,605,874 B2 8/2003 Leu et al.
(Continued)

OTHER PUBLICATIONS

Prosecution History of related U.S. Appl. No. 13/290,557, Office Action having a Notification Date of Oct. 7, 2013, all pages.

*Primary Examiner* — Brook Kebede
(74) *Attorney, Agent, or Firm* — Catherine Ivers; Ira D. Blecker

(57) ABSTRACT

A metal interconnect structure, which includes metal alloy capping layers, and a method of manufacturing the same. The originally deposited alloy capping layer element within the interconnect features will diffuse into and segregate onto top surface of the metal interconnect. The metal alloy capping material is deposited on a reflowed copper surface and is not physically in contact with sidewalls of the interconnect features. The metal alloy capping layer is also reflowed on the copper. Thus, there is a reduction in electrical resistivity impact from residual alloy elements in the interconnect structure. That is, there is a reduction, of alloy elements inside the features of the metal interconnect structure. The metal interconnect structure includes a dielectric layer with a recessed line, a liner material on sidewalls, a copper material, an alloy capping layer, and a dielectric cap.

20 Claims, 8 Drawing Sheets

(56) References Cited

U.S. PATENT DOCUMENTS

| | | |
|---|---|---|
| 8,053,894 B2 | 11/2011 | Wan et al. |
| 8,492,274 B2 * | 7/2013 | Yang et al. .................... 438/652 |
| 8,502,381 B2 | 8/2013 | Ivanov |
| 2006/0276030 A1 * | 12/2006 | Wang et al. ................... 438/631 |
| 2008/0277791 A1 * | 11/2008 | Lee, Jae-Suk ................ 257/751 |
| 2010/0075498 A1 | 3/2010 | Takagi et al. |

* cited by examiner

METAL ALLOY CAP INTEGRATION

RELATED APPLICATION

This application is a continuation of U.S. patent application Ser. No. 13/653,665, entitled "Metal Alloy Cap Integration", filed Oct. 17, 2012, which in turn is a Continuation-in-part of U.S. patent application Ser. No. 13/290,557, entitled "Metal Alloy Cap Integration", filed Nov. 7, 2011, the disclosures of which are incorporated by reference herein.

BACKGROUND OF THE INVENTION

1. Field of the Invention

The present invention relates to metal interconnect structures. More particularly, the present invention relates to copper interconnects with metal alloy capping layers having reduced electrical resistivity impact from alloy elements in the copper interconnect structure.

2. Description of the Related Art

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect, which eventually results in a circuit opening.

Copper interconnects containing a metal cap have been approved as a preferred structure to resist electromigration. While various alternate metal capping approaches have been proposed to reduce electromigration-induced copper transport and void growth, virtually all involve a tradeoff between improvement and copper resistivity increase. Additional liabilities may include undesirable line-to-line leakages and capacitance increases. Cobalt-tungsten-phosphorus capping processes have been recently evaluated and demonstrated as a promising process to enhance electromigration resistance. However, this electroless plating approach adds processing steps, for example, pre- and post-cleans, and increases wafer cost. Copper-manganese alloy seeding processes have also been recently evaluated and demonstrated as a promising process to enhance electromigration resistance. However, "residual" manganese within the copper interconnect increases the electrical resistivity.

In view of the above, there is a need for providing an interconnect structure which avoids a circuit opening caused by EM failure as well as electrical shorts between adjacent interconnect structures.

SUMMARY OF THE INVENTION

The present invention provides a metal interconnect structure, which includes metal alloy capping layers. The originally deposited alloy capping layer element within the interconnect features will diffuse into and segregate onto top surface of the metal interconnect. The metal alloy capping material is deposited on a reflowed copper surface and is not physically in contact with sidewalls of the interconnect features. Thus, there is a reduction in electrical resistivity impact from residual alloy elements in the interconnect structure. That is, there is a reduction, of alloy elements inside the features of the metal interconnect structure. Also, a second reflow annealing of the deposited metal alloy capping material on the pure copper enables sufficient amount of the metal alloy into the patterned features.

According to an embodiment of the present invention, a method of forming a metal interconnect structure is provided. The method includes steps of: providing a recessed pattern in a dielectric material; filling at least a portion of the recessed pattern with copper; forming an alloy capping layer on the copper comprising an alloying element; reflowing the deposited alloy capping layer on the copper; planarizing the metal interconnect structure to expose a top surface of the dielectric material; and depositing a capping layer, wherein the alloying element in the structure is segregated and distributed along an interface between the copper and the dielectric cap.

BRIEF DESCRIPTION OF THE DRAWINGS

The features and elements of the present invention are set forth with respect to the appended claims and illustrated in the drawings.

DETAILED DESCRIPTION OF THE PREFERRED EMBODIMENTS

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present invention provides a metal interconnect structure, which includes metal alloy capping layers. The originally deposited alloy capping layer element within the interconnect features will diffuse into and segregate onto top surface of the metal interconnect. The metal alloy capping material is deposited on a reflowed copper surface and is not physically in contact with sidewalls of the interconnect features. Thus, there is a reduction in electrical resistivity impact from residual alloy elements in the interconnect structure. That is, there is a reduction, of alloy elements inside the features of the metal interconnect structure.

Figure 1:
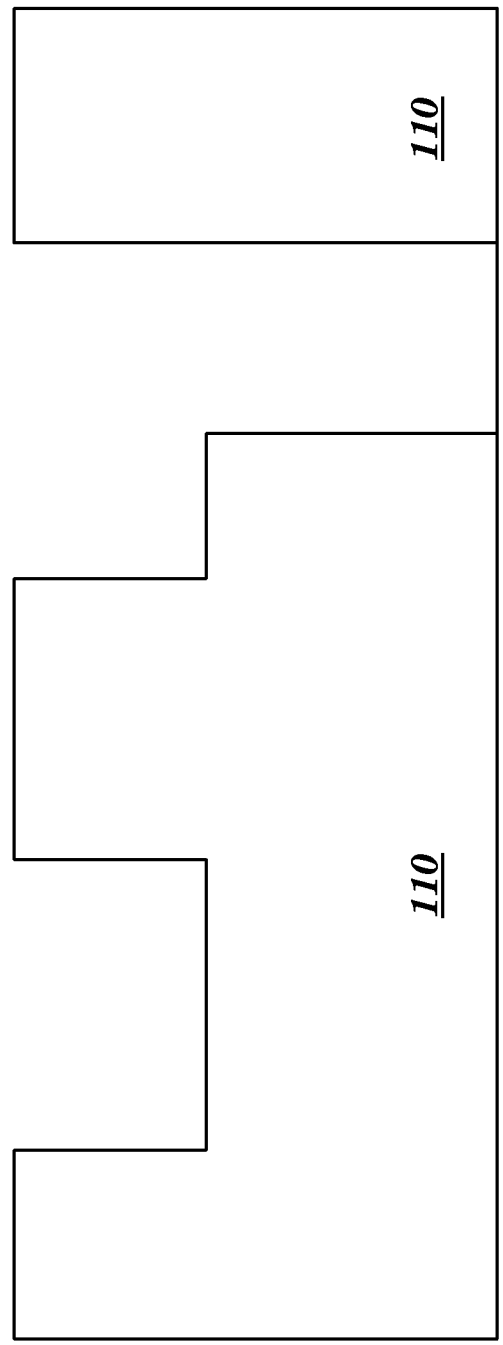
FIGS. 1-8 illustrate cross-sectional views of the formation of an interconnect structure according to embodiments of the present invention.

Reference is now made to FIGS. 1-8, which are pictorial representations illustrating one exemplary interconnect structure of the present invention through various processing steps. FIG. 1 illustrates an initial dielectric layer 110 having a recessed line pattern etched into it. The dielectric material is formed using any conventional deposition process including, but not limited to, chemical vapor deposition (CVD), plasma enhanced chemical vapor deposition (PECVD), evaporation, chemical solution deposition and spin-on coating.

The dielectric layer 110 that is employed in the present disclosure may include any interlevel or intralevel dielectric including inorganic dielectrics or organic dielectrics. In one embodiment, the dielectric layer 110 may be non-porous. In another embodiment, the dielectric layer 110 may be porous. Some examples of suitable dielectrics that can be used for the dielectric layer 110 include, but are not limited to, silicon oxide ($SiO_2$), silsequioxanes, C-doped oxides (e.g., organosilicates) that include atoms of silicon (Si), carbon (C), oxygen (O) and hydrogen (H), thermosetting polyarylene ethers, or multi-layers thereof. The term "polyarylene" is used in this application to denote aryl moieties or inertly substituted aryl moieties, which are linked together by bonds, fused rings, or inert linking groups such as, for example, oxygen, sulfur, sulfone, sulfoxide, carbonyl and the like.

The dielectric layer 110 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric layer 110 may vary depending upon the type of dielectric material used as well as the exact number of dielectric layers within the dielectric layer 110. Typically, and for normal interconnect structures, the dielectric layer 110 has a thickness from 50 nm to 1000 nm.

The patterning process for creating the features in FIG. 1 involves lithography and etching steps. The lithographic process includes forming a photoresist (not shown) directly on the dielectric layer 110, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing at least one opening into at least the dielectric layer 110. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying dielectric layer 110.

Figure 2:
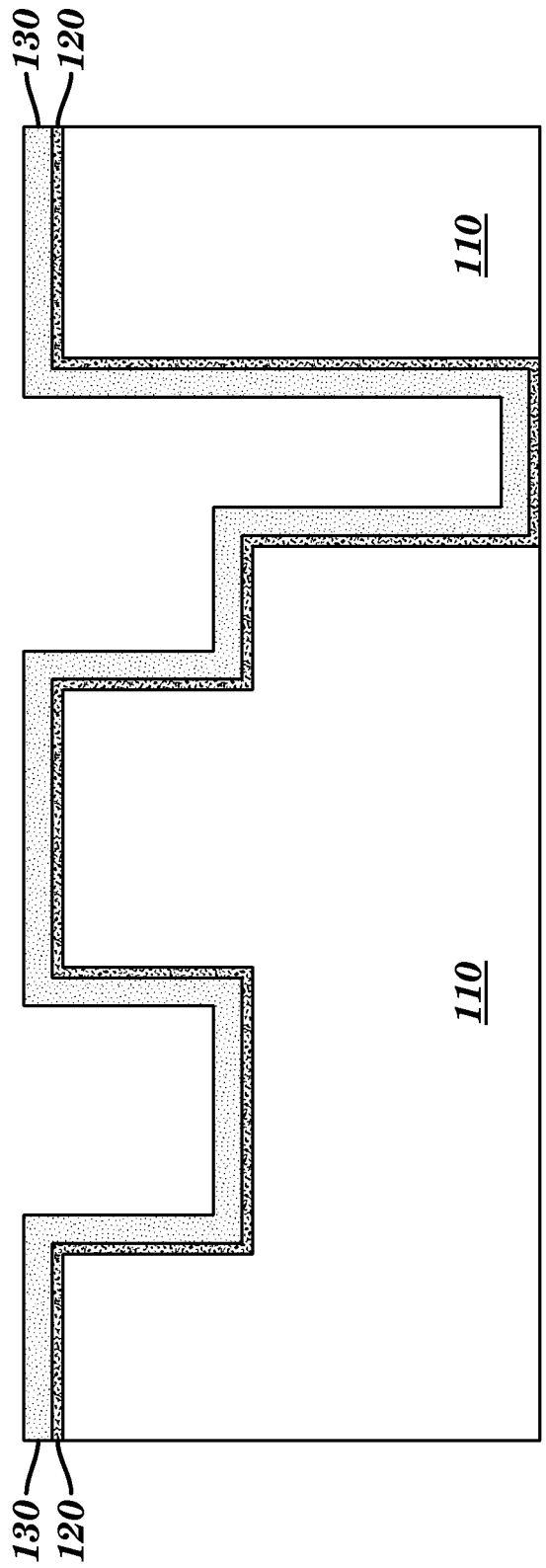

Moving to FIG. 2, a liner 120 and a seed layer 130 are formed in the recessed line pattern. The liner 120 can include cobalt (Co), ruthenium (Ru), iridium (Ir), rhodium (Rh), platinum (Pt), lead (Pb), tantalum (Ta), titanium (Ti), tungsten (W), nitrides of any of the foregoing or any combination thereof. The seed layer 130 is composed of copper (Cu).

The liner 120 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. The thickness of the liner 120 may vary depending on the deposition process used as well as the material employed. Typically, the liner 120 has a thickness from 2 nm to 50 nm, with a thickness from 5 nm to 20 nm being more typical.

The seed layer 130 that is formed includes both pure Cu and Cu with impurity elements. The impurity elements include, but are not limited to, phosphorus (P), sulfur (S), carbon (C), chlorine (Cl), and oxygen (O). The seed layer 130 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. The thickness of the seed layer 130 may vary depending on the deposition process used as well as the material employed. Typically, the seed layer 130 has a thickness from 1 nm to 50 nm, with a thickness from 2 nm to 20 nm being more typical.

Figure 3:
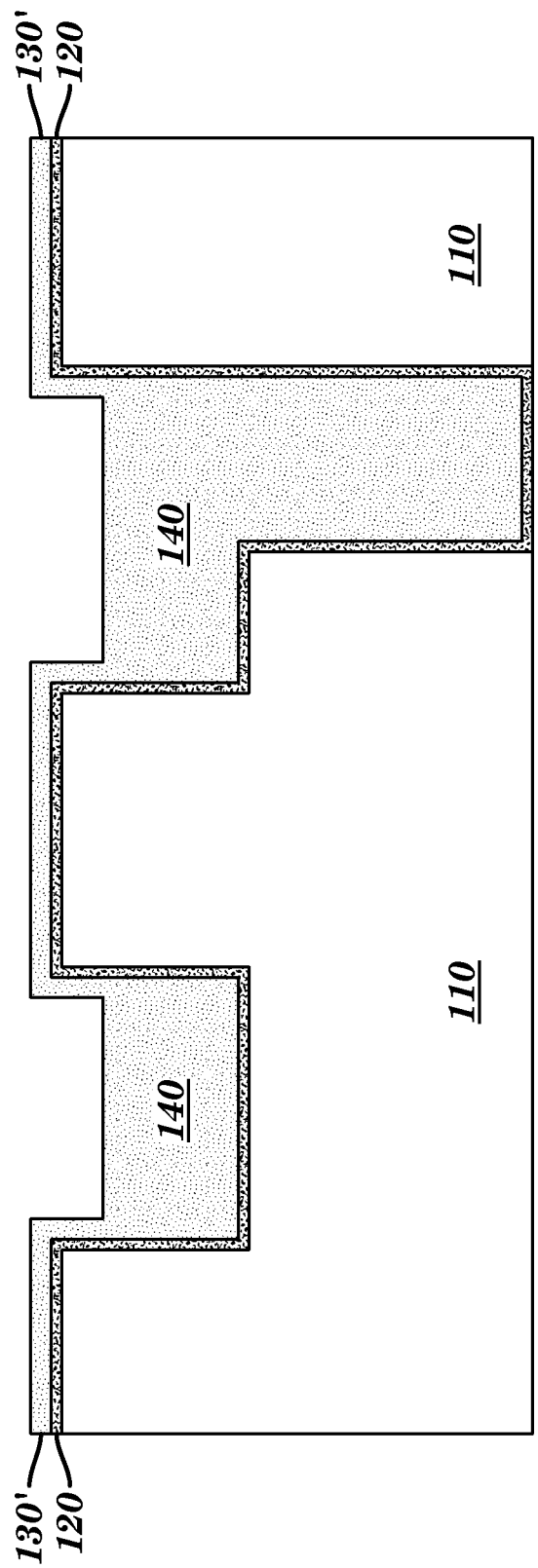

FIG. 3 shows the recessed line pattern at least partially filled with a copper material 140. The recessed line pattern is filled using a reflowed annealing process. The reflow is performed in order to reduce the surface energy of the interconnect structure. A majority of the copper material 140 will fill into the small features in the interconnect structure. Seed layer 130' is thinner than shown in FIG. 2 as 130. The thinning is a result of the seed layer being reflowed with copper material 140 during the feature fill. The Cu reflow process was carried out at a temperature range between 100° C. and 400° C. in a forming gas environment.

Figure 4:
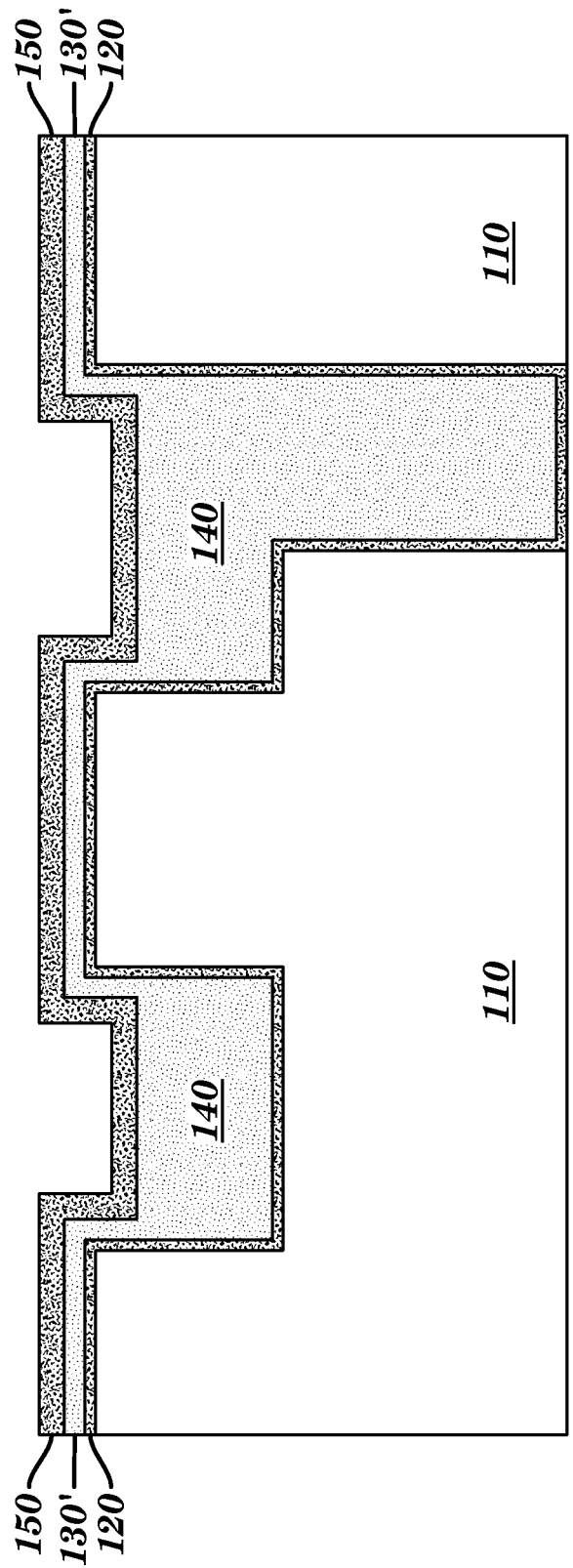

An alloy capping layer 150 is deposited in FIG. 4. The capping layer 150 is a metal alloy including at least one of manganese, copper-manganese, aluminum, iridium, ruthenium, cobalt-tungsten-phosphorus, platinum or a combination thereof. The capping layer 150 may be formed by depositing an alloy element from the foregoing list on the copper material 140 and seed layer 130' and then alloying with the copper material 140 and/or seed layer 130'. Alternatively, an alloy containing the alloying element plus copper may be directly deposited on the copper material 140 and seed layer 130'. Capping layer 150 is shown in FIG. 4 as a thin cap, on the order of approximately 1 nm-6 nm. Capping layer 150 could be thicker than 1 nm-6 nm, for example 3 nm-10 nm, but it may require a longer chemical mechanical polish in a subsequent step. The capping layer 150 is directly deposited on the surface of the reflowed copper material 140 and is not physically in contact with sidewalls of the recessed (patterned) features.

The capping layer 150 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. The thickness of the capping layer 150 may vary depending on the deposition process used as well as the material employed.

Figure 5:
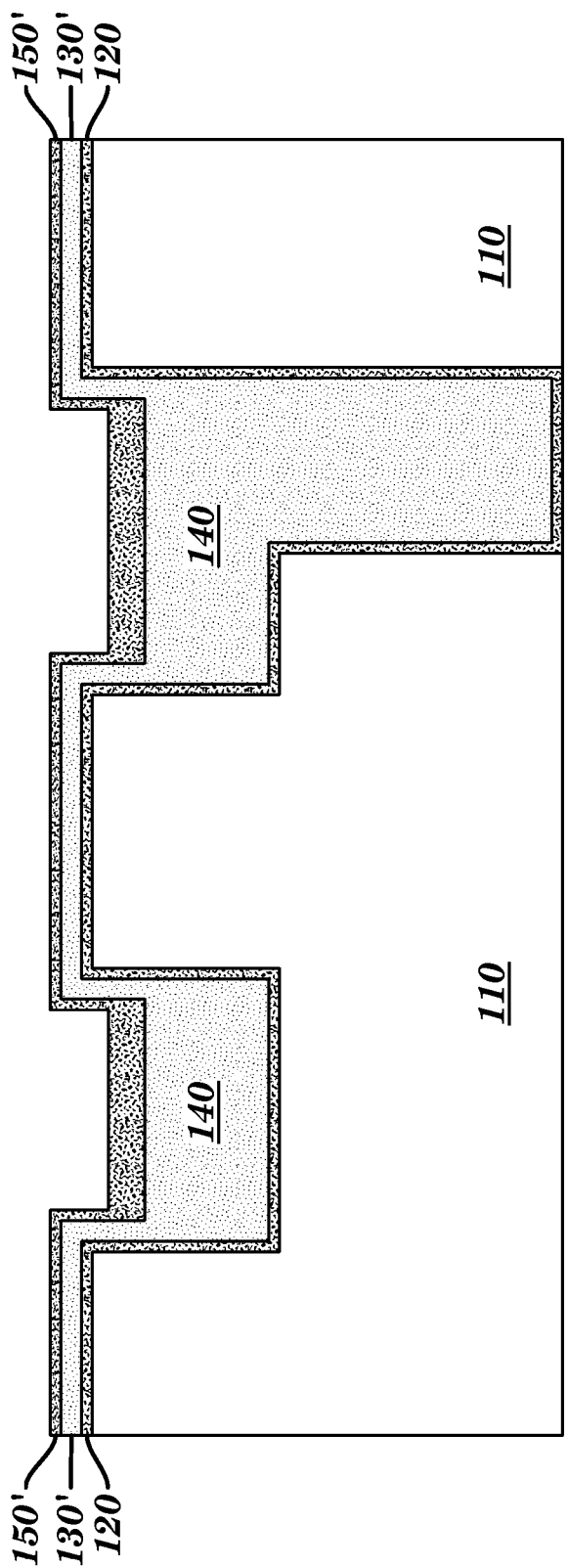

After depositing the capping layer 150 on the Cu 130', a thermal annealing process is carried out to reflow a majority of the capping layer material 150 at the field area (non-feature area) into the patterned features. The reflowed capping layer 150' is shown in FIG. 5. The parts of the capping layer 150' not in the small patterned features is thinner than that shown in FIG. 4 due to the reflow of the capping layer 150' into the small patterned features in the interconnect structure. The reflow of the capping layer 150 to capping layer 150' also thins the capping layer 150 on the sidewall of the patterned features. By thinning the capping layer 150 in the reflow process to capping layer 150', a subsequent chemical mechanical polishing step becomes easier. The reflow of the capping layer 150' was carried out at a temperature in the range of approximately 150-350° C. and in a nitrogen (N2) and/or hydrogen (H2) containing environment for about 2 to 60 minutes.

Figure 6:
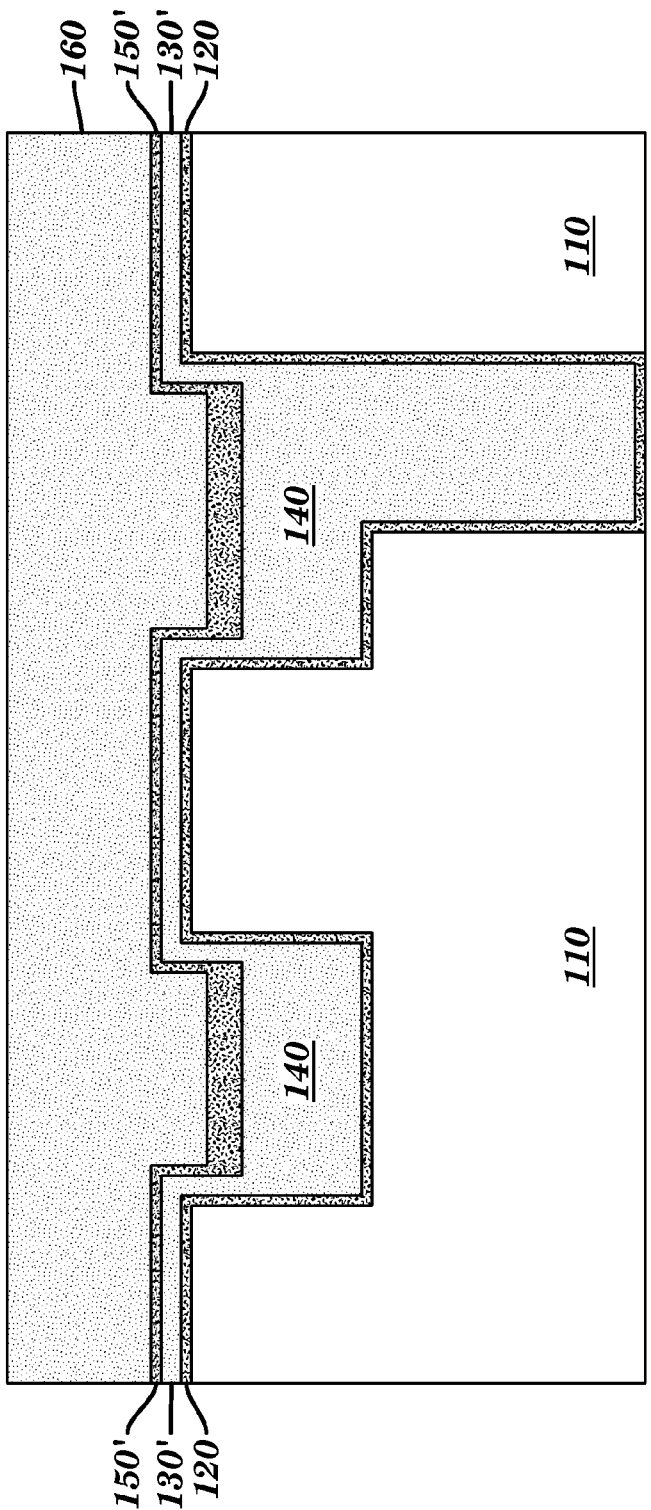
Figure 7:
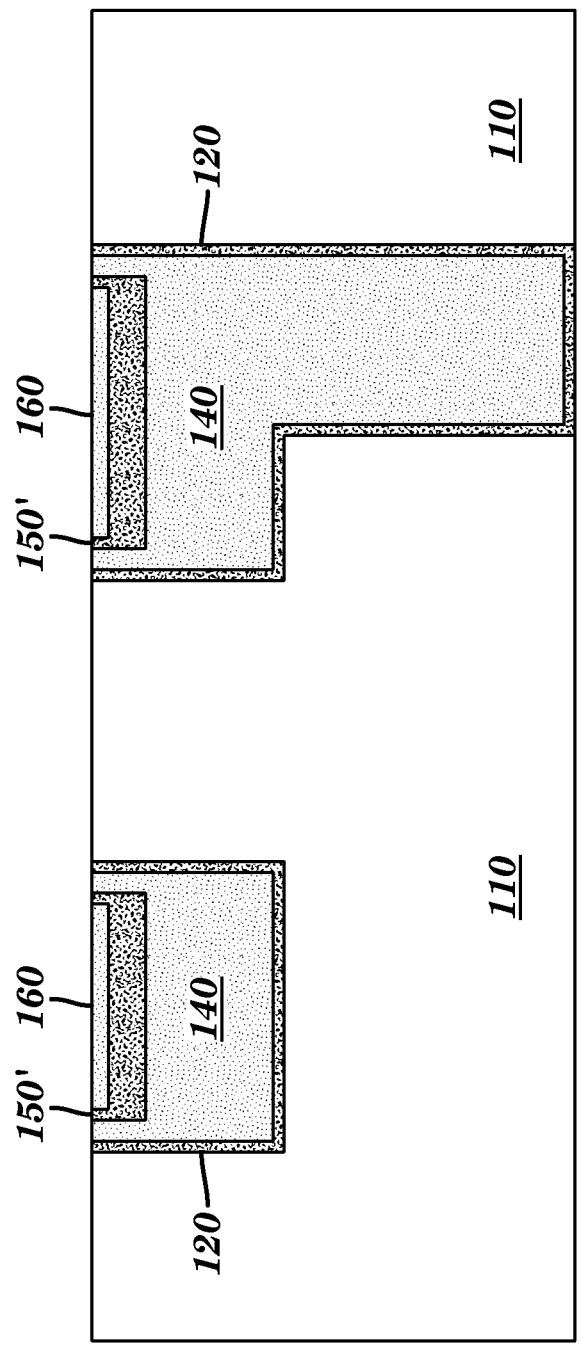
Figure 8:
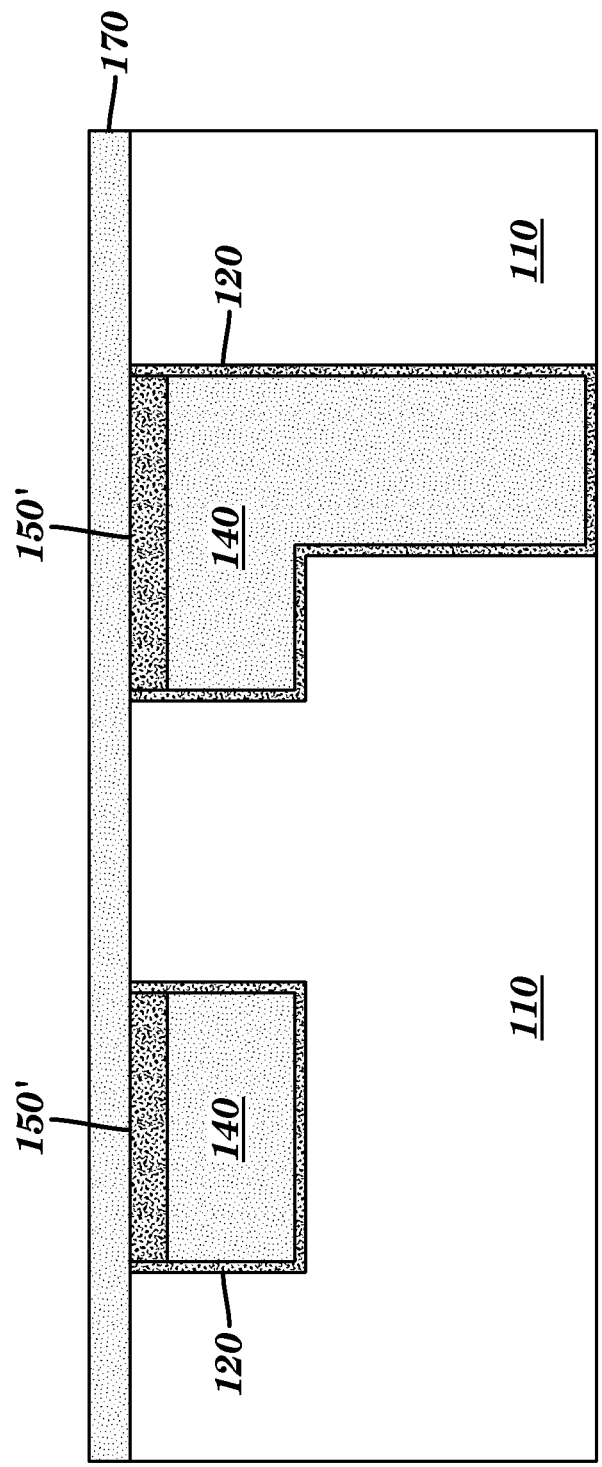

The recessed line pattern is further filled above capping layer 150' to fill the recessed line pattern in its entirety, as shown in FIG. 6. The recessed line pattern is filled with an electroplated copper material 160. More copper is used to fill the recessed line pattern in order to guarantee full fill coverage in the interconnect structure. The extra electroplated copper is then removed using a chemical mechanical polish until the liner material 120 is completely removed from the field area (non-feature area) as shown in FIG. 7. An optional further polishing step may remove any copper material 160 in the patterned features down to the capping layer 150'. A blanket dielectric cap 170 is then formed on the interconnect structure as shown in FIG. 8 (Note that FIG. 8 shows an embodiment in which the optional polishing step to remove any copper material 160 in the patterned features has bee performed). During deposition of the dielectric cap 170, the capping liner 150' is segregated and distributed along the interface between the copper material 140 and the dielectric cap 170. Dielectric cap 170 may be composed of NBlock material.

The dielectric cap 170 can be formed by a deposition process including, for example, chemical vapor deposition (CVD), and plasma enhanced chemical vapor deposition (PECVD). The thickness of the dielectric cap 170 may vary depending on the deposition process used as well as the material employed. Typically, the dielectric cap 170 has a thickness from 1 nm to 100 nm, with a thickness from 10 nm to 50 nm being more typical.

An advantage of the exemplary embodiments is that there is little or no alloy element from the capping layer 150' (other than copper) in the copper 140 in the patterned features so that there is no increase in the resistance of the copper 140.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a metal interconnect structure, comprising steps of:
   providing a recessed pattern in a dielectric material;
   filling at least a portion of the recessed pattern with copper;
   forming an alloy capping layer on the copper comprising an alloying element;
   reflowing the deposited alloy capping layer on the copper;
   planarizing the structure to expose a top surface of the dielectric material; and
   depositing a dielectric cap, wherein the alloying element in the metal interconnect structure is distributed along an interface between the copper and the dielectric cap.

2. The method of claim 1, further comprising forming another copper layer on the reflowed alloy capping layer.

3. The method of claim 2, wherein between the steps of planarizing and depositing the dielectric cap, further comprising polishing down to the alloy capping layer at a bottom surface of the another copper layer.

4. The method of claim 1 wherein after reflowing, the deposited alloy capping layer comprises copper.

5. The method of claim 1 wherein the alloy capping layer is formed in the recessed pattern and outside of the recessed pattern and wherein the alloy capping layer after reflowing has a thickness which is greater in the recessed pattern than outside of the recessed pattern.

6. The method of claim 1 wherein the alloying element in the metal interconnect structure is at a level which is at or below the top surface of the dielectric material.

7. The method of claim 1, wherein the alloy capping layer has a thickness in the range of 1 nm to 6 nm.

8. The method of claim 1, wherein the alloy capping layer has a thickness in the range of 3 nm to 10 nm, and at least a portion of the alloy capping layer is embedded in the copper material.

9. The method of claim 1, wherein the alloying element is selected from the group of manganese, copper-manganese, cobalt, aluminum, iridium, ruthenium, cobalt-tungsten-phosphorus, platinum and combinations thereof.

10. The method of claim 1, further providing forming a liner on at least a sidewall of the recessed pattern wherein the liner is comprised of cobalt, ruthenium, iridium, rhodium, platinum, lead, nitrides of any of the foregoing, and combinations thereof.

11. The method of claim 10, wherein the liner has a thickness from about 2 nm to about 50 nm.

12. The method of claim 9, wherein the liner has a thickness from about 5 nm to about 20 nm.

13. The method of claim 1 wherein the alloying element distributed along an interface between the copper and the dielectric cap is segregated so as not present in the copper in a bulk region of the recessed pattern.

14. The method of claim 1, wherein the dielectric material comprises an organosilicate.

15. The method of claim 1, wherein the dielectric material has a dielectric constant less than or equal to 2.8.

16. The method of claim 1, further comprising depositing a copper seed layer in the recessed pattern wherein the copper seed layer comprises at least one impurity element selected from the group consisting of phosphorus (P), sulfur (S), carbon (C), chlorine (Cl), and oxygen (O).

17. The method of claim 1, wherein reflowing comprises annealing.

18. The method of claim 17 wherein annealing occurs at a temperature less than 350 C.

19. The method of claim 17 wherein reflowing occurs in a nitrogen (N2) and/or hydrogen (H2) containing environment.

20. The method of claim 19 wherein reflowing occurs from about 2 minutes to about 60 minutes.

* * * * *